(12) United States Patent
Wan et al.

(10) Patent No.: US 9,969,655 B2
(45) Date of Patent: May 15, 2018

(54) ARTICLES WITH ENHANCED TEMPERATURE CAPABILITY

(71) Applicant: GENERAL ELECTRIC COMPANY, Schenectady, NY (US)

(72) Inventors: Julin Wan, Rexford, NY (US); Don Mark Lipkin, Niskayuna, NY (US)

(73) Assignee: GENERAL ELECTRIC COMPANY, Schenectady, NY (US)

(*) Notice: Subject to any disclaimer, the term of this patent is extended or adjusted under 35 U.S.C. 154(b) by 266 days.

(21) Appl. No.: 14/878,000

(22) Filed: Oct. 8, 2015

(65) Prior Publication Data
US 2017/0101348 A1    Apr. 13, 2017

(51) Int. Cl.
| | | |
|---|---|---|
| *C04B 41/85* | (2006.01) | |
| *C04B 41/50* | (2006.01) | |
| *C23C 16/04* | (2006.01) | |
| *B32B 18/00* | (2006.01) | |
| C04B 35/584 | (2006.01) | |
| C04B 35/58 | (2006.01) | |

(52) U.S. Cl.
CPC .......... *C04B 41/5006* (2013.01); *B32B 18/00* (2013.01); *C04B 41/5058* (2013.01); *C04B 41/5062* (2013.01); *C04B 41/5064* (2013.01); *C23C 16/045* (2013.01); C04B 35/584 (2013.01); C04B 35/58092 (2013.01); F05D 2220/32 (2013.01)

(58) Field of Classification Search
None
See application file for complete search history.

(56) References Cited

U.S. PATENT DOCUMENTS

| | | | |
|---|---|---|---|
| 6,268,820 B1 * | 7/2001 | Sherry | G06F 3/05 341/139 |
| 6,296,941 B1 | 10/2001 | Eaton et al. | |
| 6,410,148 B1 | 6/2002 | Eaton et al. | |
| 8,455,103 B2 | 6/2013 | Louchet-Pouillerie et al. | |
| 8,673,400 B2 | 3/2014 | Kirby et al. | |
| 2010/0255289 A1 | 10/2010 | Lewinsohn et al. | |
| 2011/0027558 A1 * | 2/2011 | Kirby | C04B 41/009 428/215 |
| 2011/0311804 A1 * | 12/2011 | Diss | C04B 41/009 428/325 |
| 2014/0011038 A1 | 1/2014 | Das et al. | |
| 2014/0072816 A1 | 3/2014 | Lee | |
| 2014/0093381 A1 | 4/2014 | Delvaux et al. | |
| 2014/0255680 A1 | 9/2014 | Lee et al. | |
| 2017/0022113 A1 * | 1/2017 | Opila | F01D 5/288 |

FOREIGN PATENT DOCUMENTS

| | | |
|---|---|---|
| WO | 2007089666 A2 | 8/2007 |
| WO | 2013188516 A1 | 12/2013 |
| WO | 2014138108 A1 | 9/2014 |

OTHER PUBLICATIONS

Zhou et al., "Effects of Impurities and Manufacturing Methods on the Devitrification of Silica Fibers", Journal of the American Ceramic Society, vol. 74, Issue 5, pp. 1125-1128, May 1991.
European Search Report and Opinion issued in connection with corresponding EP Application No. 16192218.2 dated Feb. 9, 2017.

* cited by examiner

*Primary Examiner* — Marc S Zimmer
(74) *Attorney, Agent, or Firm* — John P. Darling

(57) ABSTRACT

The disclosure provides for an article including a substrate, an environmental barrier coating (EBC), a bondcoat and a boron source. The substrate may include a silicon-including ceramic material. The EBC may be disposed over the substrate, and the bondcoat may disposed between the substrate and the EBC. The bondcoat may include silicon. The boron source may be disposed within the article to provide an effective amount of boron to form an oxide including silicon and at least 0.1 weight percent boron during exposure of the bondcoat to an oxidizing environment at a temperature greater than 900 degrees Celsius. The oxide may be a borosilicate glass that is substantially devitrification resistant to prevent spallation of the EBC and thereby enhance the temperature capability of the article.

31 Claims, 5 Drawing Sheets

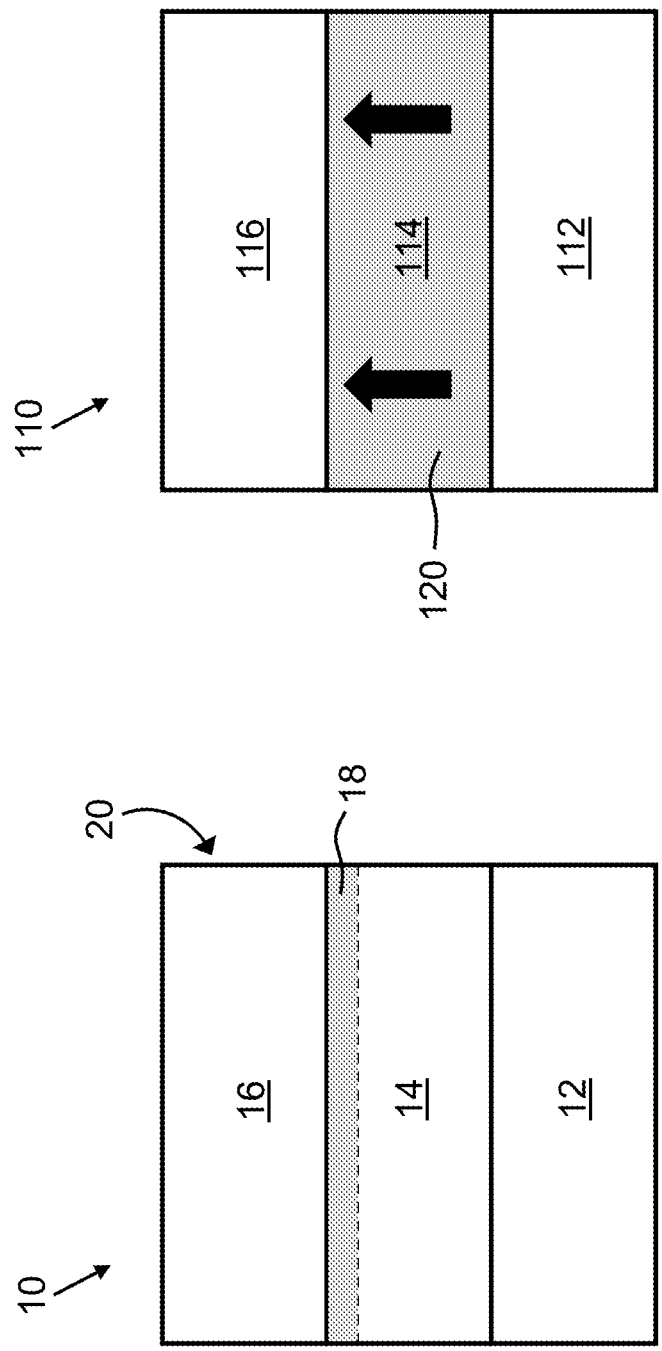

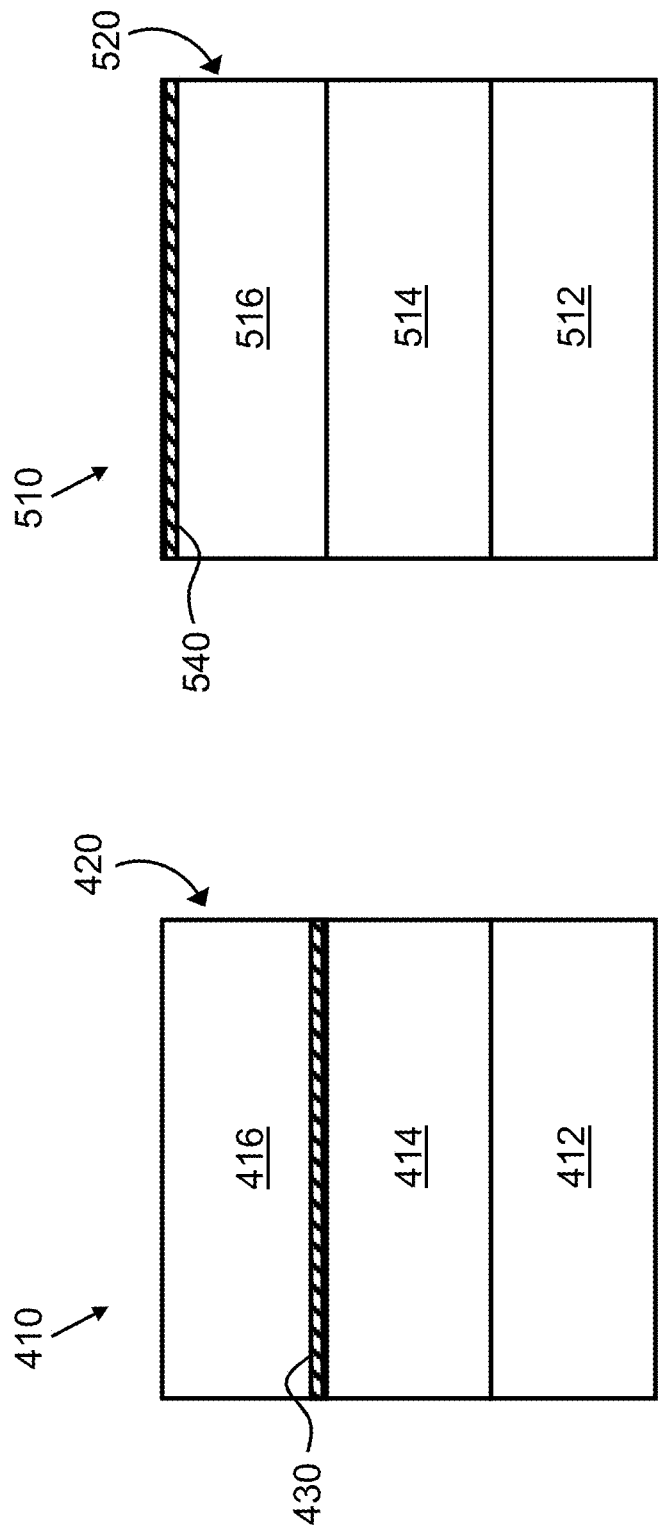

ARTICLES WITH ENHANCED TEMPERATURE CAPABILITY

BACKGROUND

This disclosure relates generally to high temperature articles with an environmental barrier coating and a bondcoat with enhanced temperature capability. More particularly, this disclosure relates to high temperature ceramic matrix composite articles with an environmental barrier coating and a bondcoat that are configured to form, and/or include, an amorphous and devitrification resistant thermally grown oxide region, and methods of forming same.

High-temperature materials, such as, for example, ceramics, alloys, and intermetallics, offer attractive properties for use in structures designed for service at high temperatures in such applications as gas turbine engines, heat exchangers, and internal combustion engines, for example. However, the environments characteristic of these applications often include reactive species, such as water vapor, which at high temperatures may cause significant degradation of the material structure. For example, water vapor has been shown to cause significant surface recession and mass loss in silicon-bearing materials. The water vapor reacts with the structural material at high temperatures to form volatile silicon-including species, often resulting in unacceptably high recession rates.

Environmental barrier coatings (EBC's) are applied to silicon-bearing materials and other materials susceptible to attack by reactive species, such as high temperature water vapor; EBC's provide protection by prohibiting contact between the environment and the surface of the silicon-bearing substrate. EBC's applied to silicon-bearing substrates, for example, are designed to be relatively stable chemically in high-temperature, water vapor-including environments. One exemplary conventional EBC system, as described in U.S. Pat. No. 6,410,148, includes a silicon or silica bond layer (also referred to herein as a "bondcoat") applied to a silicon-bearing substrate; an intermediate layer including mullite or a mullite-alkaline earth aluminosilicate mixture deposited over the bond layer, such as a silicon bond layer; and a top layer including an alkaline earth aluminosilicate deposited over the intermediate layer. In another example, U.S. Pat. No. 6,296,941, the top layer is a yttrium silicate layer rather than an aluminosilicate.

The above coating systems can provide suitable thermal and environmental protection for articles in demanding environments, but opportunities for improvement in coating performance exist.

Therefore, there is a need in the art for EBC systems for articles with improved temperature capabilities, and related articles and methods. Similarly, there is a need for ceramic matrix composite articles with environmental barrier coatings and bondcoats that include enhanced temperature capabilities, and related methods for making them.

SUMMARY

In one aspect, the present disclosure provides an article including a substrate including a silicon-including material, an environmental barrier coating (EBC) disposed over the substrate, and a bondcoat disposed between the substrate and the EBC, the bondcoat including silicon. The article further includes a boron source disposed to provide an effective amount of boron to form an oxide including silicon and at least 0.1 weight percent boron during exposure of the bondcoat to an oxidizing environment at a temperature greater than 900 degrees Celsius.

In some embodiments, the oxide includes at least about 0.5 wt % boron. In some embodiments, the oxide includes no more than about 10 wt % boron. In some embodiments, the oxide is substantially amorphous and substantially devitrification resistant. In some embodiments, the oxide is disposed between the bondcoat and the EBC. In some embodiments, the bondcoat includes the boron source. In some embodiments, the substrate, the EBC, or both of these, include the boron source. In some embodiments, the boron source includes elemental boron in silicon solid solution. In some embodiments, the boron source includes a compound including boron. In some embodiments, the EBC includes a porous layer proximate the bondcoat.

In some embodiments, the EBC includes a hermetic layer. In some such embodiments, the EBC includes the boron source. In some embodiments, at least a portion of the boron source is interposed between at least a portion of the bondcoat and at least a portion of the EBC. In some such embodiments, at least one other portion of the boron source is disposed within the substrate, the EBC, the bondcoat, or combinations including any of the foregoing. In some embodiments, the article further includes a layer of oxide disposed between the EBC and the bondcoat, the layer of oxide including silicon and at least about 0.1 weight percent boron. In some embodiments, the silicon-including material of the substrate is a ceramic matrix composite (CMC).

In another aspect, the present disclosure provides an article including a substrate including a silicon-including material, an environmental barrier coating (EBC) disposed over the substrate, a bondcoat including silicon disposed between the substrate and the EBC, and an oxide adjacent the bondcoat including silicon and at least 0.1% boron.

In some embodiments, the oxide further includes at least 0.5 weight percent boron. In some embodiments, the oxide is substantially amorphous and devitrification resistant. In some embodiments, the article further includes a boron source disposed to provide boron to the oxide during exposure of the bondcoat to an oxidizing environment at a temperature greater than 900 degrees Celsius. In some such embodiments, the bondcoat includes the boron source. In some other such embodiments, the substrate, the EBC, or both of these, include the boron source.

In another aspect, the present disclosure provides a method of producing a component. The method includes disposing a bondcoat including silicon over a silicon-including substrate, and disposing an environmental barrier coating (EBC) over the bondcoat. The method further includes providing a boron source disposed to provide an effective amount of boron to form an oxide including silicon and at least 0.1 weight percent boron during exposure of the bondcoat to an oxidizing environment at a temperature greater than 900 degrees Celsius.

In some embodiments, the method further includes heating the bondcoat in an oxidizing environment to form the oxide includes silicon and at least 0.1 weight percent boron. In some embodiments, the oxide includes at least about 0.5 wt % boron. In some embodiments, the oxide includes no more than about 10 wt % boron. In some embodiments, the oxide is substantially amorphous and devitrification resistant. In some embodiments, the bondcoat includes the boron source. In some embodiments, the substrate, the EBC, or both of these, include the boron source.

In some embodiments, the silicon-including material of the substrate is a ceramic matrix composite (CMC). In some embodiments, the boron source forms gaseous byproducts during formation of the oxide, and forming an EBC on the bondcoat includes forming a porous layer proximate the bondcoat that allows the gaseous byproducts to travel through the porous layer.

In some embodiments, forming an EBC on the bondcoat includes forming a hermetic layer that prevents boron-including gaseous byproducts from migrating away from the oxide during formation thereof.

In some embodiments, providing the boron source includes providing at least a portion of the boron source within an intermediate layer interposed between at least a portion of the bondcoat and at least a portion of the EBC. In some such embodiments, the method further includes providing at least a portion of the boron source within at least one of the substrate, the EBC and the bondcoat.

These and other aspects, features, and advantages of this disclosure will become apparent from the following detailed description of the various aspects of the disclosure taken in conjunction with the accompanying drawings.

BRIEF DESCRIPTION OF THE FIGURES

The subject matter, which is regarded as the disclosure, is particularly pointed out and distinctly claimed in the claims at the conclusion of the specification. The foregoing and other features, aspects, and advantages of the disclosure will be readily understood from the following detailed description taken in conjunction with the accompanying drawings, wherein:

FIG. 3 depicts a cross-section of a portion of an article according to the present disclosure;

FIG. 4 depicts a cross-section of a portion of another article according to the present disclosure;

FIG. 7 depicts a cross-section of a portion of another article according to the present disclosure;

FIG. 8 depicts a cross-section of a portion of another article according to the present disclosure.

DETAILED DESCRIPTION

Figure 2:
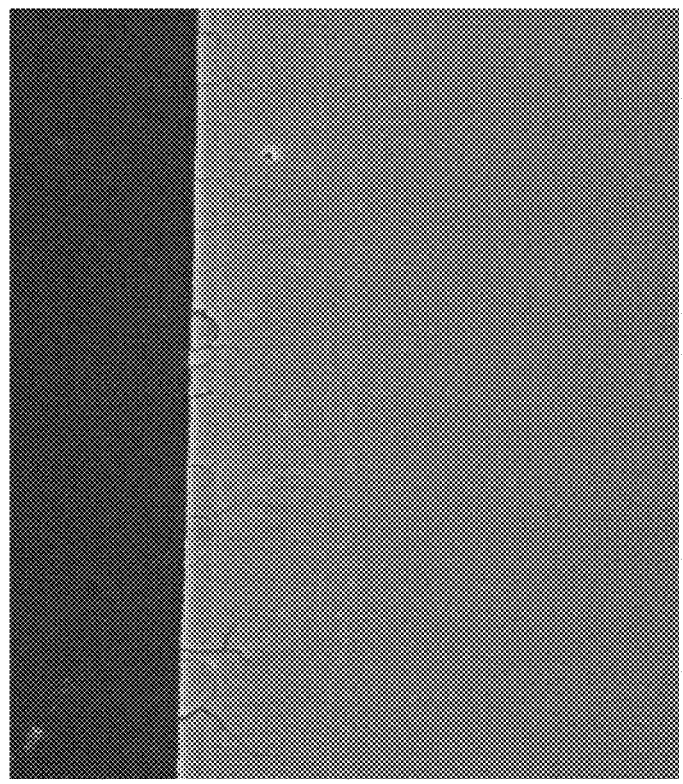
FIG. 2 is an image of a portion of a borosilicate glass with about 1% boron.

Reference will be made below in detail to exemplary embodiments of the disclosure, examples of which are illustrated in the accompanying drawings. Wherever possible, the same reference numerals used throughout the drawings refer to the same or like parts.

Some articles with a substrate, such as a silicon-including ceramic matrix composite (CMC) substrate, may include an environmental barrier coating (EBC), such as an oxide-including EBC, to provide thermal barrier protection as well as to protect against recession of the substrate via volatilization or corrosion. As discussed above, a bondcoat may be utilized between the substrate and the EBC to enhance the adhesion of the EBC to the substrate and, potentially, function as a sacrificial oxidation layer.

Figure 1:
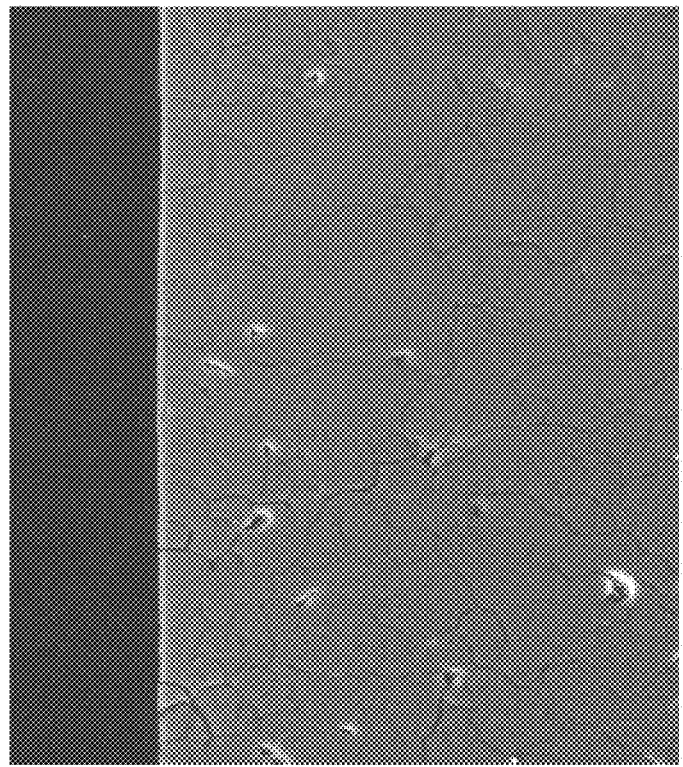
FIG. 1 is an image of a portion of a crystallized fused silica sample.

The inventors have recognized that when a silicon-including bondcoat is utilized between a silicon-including substrate (e.g., a ceramic substrate) and an EBC, the bondcoat may oxidize during thermal exposure to form an oxide scale, also known as a thermally grown oxide (TGO) layer, of silica. The inventors have also determined that while a pure silica oxide may initially be amorphous, the silica has a strong tendency to devitrify, such as during high temperature conditions. For example, FIG. 1 shows an image of a sample of fused silica that was exposed to air at about 1482 degrees Celsius for about 99 hours. As shown in FIG. 1, the silica sample crystallized throughout its thickness.

The inventors have further recognized that crystallized silica oxide layers (e.g., TGO layers) tend to crack upon cooling due to a deleterious, stress-generating phase transformation. For example, cooling of an article with a substrate, a silicon-including bondcoat, a substantially crystalline silica TGO layer, and an EBC from a relatively high temperature may cause the crystalline silica TGO layer to undergo a deleterious, stress-generating phase transformation that produces a plurality of cracks in the silica TGO layer. Cracks in such a silica TGO layer compromise the mechanical integrity of the EBC, and may promote for delamination and ultimately spallation of the EBC upon operation in a thermally cyclic environment. The inventors have thereby determined that a substantially crystalline silica TGO layer can be a source of delamination and spallation of some EBCs, which reduces the high temperature capability of such coated articles.

To prevent or inhibit devitrification (i.e., crystallization) of a silica TGO layer, and thereby reduce the likelihood of delamination and spallation of a corresponding EBC, this disclosure is directed in part to providing an adequate amount of boron in the article such that an oxide layer is supplied with sufficient boron to substantially stabilize the amorphous structure. A silica-bearing oxide composition with boron addition is more resistant to crystallization when exposed to an oxidizing atmosphere at high temperature than a similar oxide that does not contain boron; thus a silica-bearing oxide that includes boron in sufficient quantity to at least partially stabilize the amorphous structure is referred to herein as "substantially devitrification resistant." The inventors have determined that a boron-doped oxide layer has a strong resistance to devitrification. For example, FIG. 2 illustrates an image of a sample of a borosilicate glass with about 1 wt % boron which was subjected to the same conditions as the fused silica sample described above and shown in FIG. 1. As shown in FIG. 2, as opposed to the substantially complete devitrification of the entire volume of the fused silica sample of FIG. 1, exposure of the borosilicate glass sample resulted in only relatively minor surface devitrification.

Therefore, the present disclosure utilizes boron to form a devitrification-resistant oxide (e.g., a TGO), as opposed to a crystalized oxide. For example, as illustrated in FIG. 3, the present disclosure provides an article 10, such as a turbine component, that includes a substrate 12 (e.g., a silicon-including ceramic material), an EBC 16 disposed over the substrate 12, and a silicon including bondcoat 14 disposed between the substrate 12 and the EBC 16. The article 10 may further include an oxide 18 adjacent the bondcoat 14 that includes at least 0.1 weight percent boron.

The bondcoat 14 may be oxidizable by reaction with an oxidant to form the oxide 18. In some such embodiments, the article 10 may optionally include a boron source 20 disposed within the article 10 to provide an effective amount of boron to the oxide 18 such that it includes the at least 0.1 weight percent boron during exposure of the bondcoat 14 to an oxidizing environment at a temperature greater than 900 degrees Celsius. The oxide 18 formed at least partially from the bondcoat 14 may be formed as a conventional TGO during service of the article 10 and/or pre-formed by heat treatment of the article 10, for example. The boron of the boron source 20 may be provided in solid solution or as a second phase. Such a boron-doped TGO oxide 18 may form as a continuous or discontinuous layer. In some other embodiments, rather than (or in addition to) including the boron source 20 that dopes a TGO oxide 18 during exposure of the bondcoat 14 to an oxidizing environment at a temperature greater than 900 degrees Celsius, the article 10 may include a pre-deposited oxide or a pre-deposited boron-doped oxide 18 adjacent the bondcoat 14. In this way, for example, the boron-doped oxide 18 may or may not be at least a partially thermally grown oxide, and the boron source 20 may or may not be included.

It is noted that the article 10 may be utilized in any application, such as a high temperature application (e.g., in a turbine engine) that heats the bondcoat 14 to a temperature greater than 900 degrees Celsius or a relatively low temperature application that does not heat the bondcoat 14 to a temperature greater than 900 degrees Celsius. In this way, the boron-doped oxide 18 may or may not be formed during a particular use. The boron source 20 included within the article 10 (regardless of its use), if provided, may have sufficient boron to dope the oxide 18 under oxidizing conditions at a temperature greater than 900 degrees Celsius, so as to form an oxide layer 18 having at least 0.1 weight percent boron. Stated differently, the boron source 20 is disposed in such a way so that if the bondcoat 14 were exposed to oxidizing conditions at a temperature greater than 900 degrees Celsius (e.g., during use of the article 10 or otherwise), the boron source 20 promotes the formation of a devitrification-resistant, boron-doped oxide 18 with at least 0.1 weight percent boron. The boron source 20 may thereby prevent the formation of a vulnerable crystalline oxide layer. For example, the boron source 20 may be disposed so that during exposure of the bondcoat 14 to oxidizing conditions at a temperature greater than 900 degrees Celsius, a sufficient amount of boron is supplied by solid state diffusion to the oxide layer 18 to form a boron-doped oxide 18 with at least 0.1 weight percent boron. In some embodiments, the boron of the boron source 20 may thereby be mobile such that it is able to diffuse to the oxide 18. In some embodiments, the boron-doped oxide 18 may include silica and boron oxide. In some embodiments, the boron-doped oxide 18 may be a borosilicate glass.

The amount of boron of the boron source 20 required to provide an effective amount of boron to form the boron-doped oxide 18 (e.g., at least 0.1 weight percent boron) may differ due to a number of factors. For example, the amount of boron of the boron source 20 needed to form the boron-doped oxide 18 may depend, at least in part, on the temperature at which the article 10 is designed to operate, the composition of the bondcoat 14, the composition of the EBC 16, the composition of the boron source 20, and the relative distance of the boron source 20 to the oxide 18. As another example, the boron source 20 may progressively dope the growing oxide 18 over time (i.e., the boron source 20 may gradually supply boron to the growing oxide 18 and thus become depleted over time). As such, an article 10 with a partially doped oxide 18 (i.e., a oxide 18 including less than 0.1 weight percent boron) would require less boron to dope the oxide 18 to at least 0.1 weight percent boron as compared to an article 10 with a boron-free oxide 18 or prior to oxidation of the bondcoat 14. As one of ordinary skill in the will appreciate, the location, composition and amount of boron source 20 can be designed for a particular article 10 to provide an effective amount of boron to the oxidation reaction of the bondcoat 14 under particular conditions.

While the boron source 20 may be disposed to provide an effective amount of boron to form the boron-doped oxide 18 including silicon and at least 0.1 weight percent boron during exposure of the bondcoat 14 to an oxidizing environment at a temperature greater than 900 degrees Celsius, the particular timing of the formation of the boron-doped oxide 18 may also vary depending upon a number of factors. For example, the boron-doped oxide 18 may form after an exposure time that allows sufficient boron of the boron source 20 to diffuse to the oxide 18. As another example, the boron source 20 may be provided proximate to the portion of the bondcoat 14 undergoing the oxidation reaction such that the boron-doped oxide 18 is formed promptly upon exposure. In other embodiments, the oxide may initially form without boron (e.g., a substantially pure silica oxide layer) or with less than least 0.1 weight percent boron, and require further exposure (e.g., oxidizing environment at a temperature greater than 900 degrees Celsius) to form the boron-doped oxide 18 including silicon and at least 0.1 weight percent boron. In this way, in some embodiments the boron source 20 may provide a supply of boron to the oxide 18 over a period of time. As described further below, in some embodiments the article 10 may include a, potentially distinct, intermediate layer interposed between at least a portion of the bondcoat 14 and at least a portion of the EBC 16. The boron source 20 may be provided, at least partially, within the intermediate layer. In one example, the entirety of the boron source 20 may be provided within the intermediate layer. As such, the intermediate layer may be the boron source 20. In another example, a portion of the boron source 20 may be provided within the intermediate layer and a portion may be provided within at least one of the substrate 12, the bondcoat 14 and the EBC 16.

In some embodiments, the boron source 20 may be disposed in the article 10 to provide an effective amount of boron during exposure of the bondcoat 14 to an oxidizing environment at a temperature greater than 900 degrees Celsius to form the oxide layer 18 with at least 0.5 weight percent boron. In some embodiments, the boron source 20 may be disposed in the article 10 to provide an effective amount of boron during exposure of the bondcoat 14 to an oxidizing environment at a temperature greater than 900 degrees Celsius to form the oxide layer 18 with 10 weight percent or less boron, such as a weight percentage within the range of about 0.1 weight percent to about 10 weight percent, or about 0.5 weight percent to about 10 weight percent, or about 0.5 weight percent to about 6 weight percent.

The boron source 20 may substantially include elemental boron, a compound including boron, or a combination thereof. In some embodiments the boron source 20 may substantially include elemental boron in silicon solid solution or a compound including boron. For example, the boron source 20 may include, without limitation, boron nitride, boron carbide, boron oxide, a metal boride, or a combination thereof. In some such embodiments, the boron source 20 may include a transition metal boride or a boride of the rare earth elements, such as hafnium boride, titanium boride, yttrium boride, gadolinium boride, or ytterbium boride.

The boron source 20 may be selected such that it includes chemical and thermo-mechanical compatibility with the components of the article 10. For example, the boron source 20 may be selected to include a melting point above 1300 degrees Celsius, which may allow the article 10 to be utilized in many typical high temperature applications (e.g., as a high temperature turbine component). As another example, the boron source 20 may be selected to include a relatively low boron chemical activity, which may be advantageous if the boron source 20 is provided, at least partially, within the silicon-including bondcoat 14. In some embodiments the oxide 18 may prevent or retard oxygen from interacting with the bondcoat 14 or substrate 12. In such embodiments, the boron source 20 may be selected to not unduly degrade the resistance of the oxide 18 to oxygen diffusion. For example, the boron source 20 may be selected as a metal-rich boride (e.g., a rare earth boride) which, when incorporated into the oxide 18, does not effectively degrade the resistance of the oxide 18 to oxygen diffusion.

The boron source 20 may be disposed anywhere in the article 10, so long as the boron thereof can diffuse to or be incorporated into the oxide. The boron source 20 may be disposed within the substrate 12, within the bondcoat 14, within the EBC 16, within another portion of the article 10, form an additional layer in the article 10, or a combination thereof. Any method or configuration for including the boron source 20 within the article 10 may be utilized. For example, the boron source 20 may be formed with a portion of the article 10, such as being co-deposited with the EBC 16 or the bondcoat 14 layers, or introduced as part of the substrate 12 manufacturing process. As another example, the portion of the article 10 including the boron source 20 may be modified with the boron source 20 after it is formed.

As noted above, the boron source 20 may diffuse through the article 10 from within one layer or portion to another layer or portion over time, such as during thermal exposure. As a result, although the boron source 20 may initially be included within a particular portion of the article 10, at a later time (e.g., after the article 10 is heated) at least a portion of the boron source 20 may have migrated to a different portion of the article 10 (and, potentially, not yet participated in doping the oxide 18). As also noted above, the boron source 20 may gradually diffuse through the article 10 to progressively dope the oxide 18 and thus become depleted over time. In some embodiments, after formation of the boron-doped oxide 18 with a particular amount of boron, the boron source 20 may have become depleted to such a level that it may no longer include an effective amount of boron to further dope the oxide 18. As such, while FIG. 3 shows a boron-doped oxide 18 including silicon and at least 0.1 weight percent boron and includes reference numeral 20 to generally indicate the presence of an effective boron source 20, the boron source 20 may or may not always be present in such an embodiment.

As discussed above and shown in FIG. 3, the boron source 20 may be positioned anywhere in the article 10 to form the boron-doped oxide 18 during exposure. FIG. 4 illustrates an article 110 that includes the boron source 120 positioned within the bondcoat 114 of the article 110. Article 110 is substantially similar to the article 10 of FIG. 3 described above, and therefore like reference numerals preceded with "1" are used to indicate like aspects or functions, and the description above directed to aspects or functions thereof (and the alternative embodiments thereof) equally applies to the article 110. The boron source 120 may initially be positioned within the bondcoat 114, or the boron source may have been positioned elsewhere, such as within the substrate 112, and subsequently migrated (e.g., diffused) into the bondcoat 114. It is noted that the boron-doped oxide is not illustrated in FIG. 4 as it may not yet be formed in the article 110. For example, the bondcoat 114 (or the article 110 itself) may have not have been heated sufficiently in an oxidizing environment to form the boron-doped oxide. However, as shown by the arrows in the article 110 of FIG. 4, the boron source 120 in the bondcoat 114 is effective to diffuse through the bondcoat 114 to the oxidation reaction of the bondcoat 114 and provide an effective amount of boron to form a boron-doped oxide including silicon and at least 0.1 weight percent boron during exposure of the bondcoat 114 to an oxidizing environment at a temperature greater than 900 degrees Celsius.

As shown in FIG. 4, the bondcoat 114 may overlie the substrate 112, and EBC 116 may overlie the bondcoat 114. The silicon-including bondcoat 114 may improve or provide oxidation resistance to the substrate 112 and/or enhance bonding between the substrate 112 and the EBC 116. A thickness of the bondcoat 114 between the substrate 112 and the EBC 116 may be, for example, about 25 to about 350 micrometers.

As noted above, in some embodiments the bondcoat 114 includes silicon (e.g., such as when the substrate 112 includes a silicon-bearing material). For example, the bondcoat 114 in some embodiments is substantially elemental silicon (potentially with the boron source 120 provided in solid solution or as a second phase therein). In some embodiments, the bondcoat 114 may be substantially include one or more layers of elemental silicon. In other embodiments, the bondcoat 114 may substantially include silicon carbide, silicon nitride, metal silicides, silicon alloys, or mixtures thereof instead of, or in addition to, silicon. The bondcoat 114 may include oxide phases, such as silica, rare earth silicates, rare earth aluminosilicates, and/or alkaline earth aluminosilicates (with the boron source 120 provided therein). The silicon-including bondcoat 114 may be oxidizable by reaction with an oxidant, and may, in some cases, form a gaseous product as explained further below.

Figure 5:
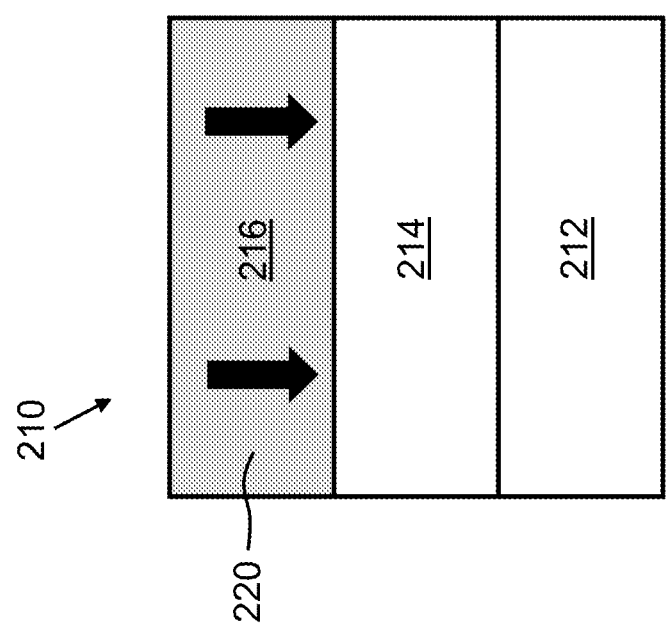
FIG. 5 depicts a cross-section of a portion of another article according to the present disclosure.

FIG. 5 illustrates an article 210 that includes the boron source 220 positioned within the EBC 216 of the article 210. Article 210 is substantially similar to the articles 10 and 110 described above, and therefore like reference numerals preceded with "2" are used to indicate like aspects or functions, and the description above directed to aspects or functions thereof (and the alternative embodiments thereof) equally applies to the article 210. The boron source 220 may initially be positioned within the EBC 216, or the boron source 220 may have been positioned elsewhere, such as over the EBC 216, and subsequently migrated into the EBC 216. It is noted that the boron-doped oxide is not illustrated in FIG. 5 as it may not yet be formed in the article 210. However, as shown by the arrows in the article 210 of FIG. 5, the boron source 220 in the EBC 216 is effective to diffuse through the EBC 216 to provide an effective amount of boron to form a boron-doped oxide including silicon and at least 0.1 weight percent boron during exposure of the bondcoat 214 to an oxidizing environment at a temperature greater than 900 degrees Celsius.

As shown in FIG. 5, the EBC 216 may be disposed on the bondcoat 214 such that the EBC 216 overlies and is bonded, either directly or indirectly, to the bondcoat 214. The EBC 216 of the article 210 may define the outer surface of the article 210. As such, the EBC 216 may interact with the environment about the article 210 and protect the substrate 212 and/or the bondcoat 214 (and any intermediate layers). The EBC may perform a multitude of sealing, reaction barrier, recession resistance, and/or thermal barrier functions.

The EBC 216 may include a ceramic material, such as an oxide. In some embodiments, the EBC 216 may be silicate-based. In one example, the EBC 216 may overlie a bond layer 214 including silicon and/or silica and applied to the silicon-bearing substrate 212. The EBC 216 itself may be one or more layers. In some embodiments, the EBC 216 layers may include one or more rare earth silicates, such as RE2Si2O7 and/or RE2SiO5, where RE includes one or more of Y, Er, Yb, Sc and Lu. In some embodiments, the EBC 216 may include an alkaline earth aluminosilicate, such as a barium aluminosilicate or a barium-strontium aluminosilicate.

Figure 6:
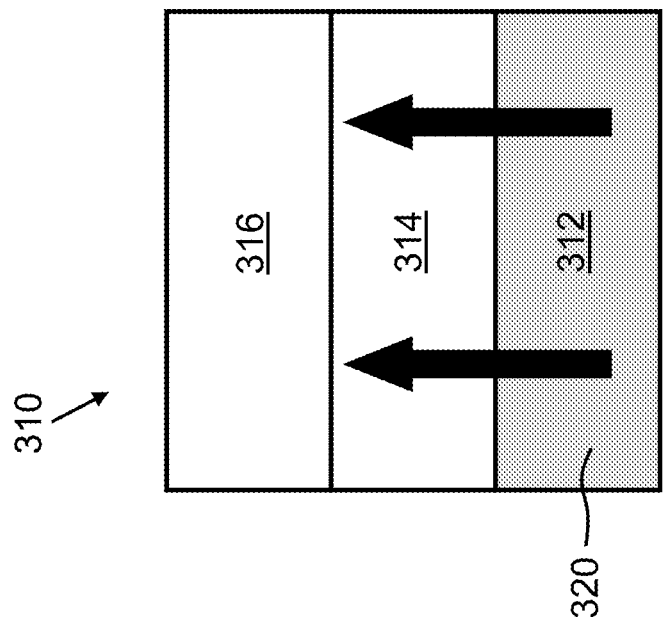
FIG. 6 depicts a cross-section of a portion of another article according to the present disclosure.

FIG. 6 illustrates an article 310 that includes the boron source 320 positioned within the substrate 312 of the article 310. Article 310 is substantially similar to the articles 10, 110 and 210 described above, and therefore like reference numerals preceded with "3" are used to indicate like aspects or functions, and the description above directed to aspects or functions thereof (and the alternative embodiments thereof) equally applies to the article 310. The boron source 320 may initially be positioned within the substrate 312, or the boron source 320 may have been positioned elsewhere and diffused into the substrate 312. It is noted that the boron-doped oxide is not illustrated in FIG. 6 as it may not yet be formed in the article 310. However, as shown by the arrows in the article 310 of FIG. 6, the boron source 320 in the substrate 312 is effective to diffuse through the substrate 312 and the bondcoat 314 to the oxidation reaction of the bondcoat 314 and provide an effective amount of boron to form a boron-doped oxide including silicon and at least 0.1 weight percent boron during exposure of the bondcoat 314 to an oxidizing environment at a temperature greater than 900 degrees Celsius.

In some embodiments, the substrate 312 may include silicon. By way of example, the substrate 312 may include silicon and be selected for high temperature mechanical, physical, and/or chemical properties. The substrate 312 may be capable of being subjected to combustion environments at operating temperatures greater than about 1100° C. for durations exceeding 10,000 hours. In one example, the substrate 312 of the article 310 may include a ceramic material, such as a ceramic matrix composite (CMC) material, such as a ceramic matrix reinforced with ceramic fibers. In such a CMC embodiment, the fibers and/or the matrix may include silicon carbide. Some examples of silicon-including CMC substrates 312 include, but are not limited to, matrix and/or fibers including silicon carbide, silicon nitride, silicon oxycarbides, silicon oxynitrides, and mixtures thereof. Examples of some CMC substrates 312 that may be utilized in the article 310 include, but are not limited to, a CMC substrate 312 with a silicon carbide matrix and silicon carbide fibers (SiC—SiC), a silicon nitride matrix and silicon carbide fibers (Si3N4-SiC), and a silicon carbide/silicon nitride matrix mixture and silicon carbide fibers (Si3N4/SiC—SiC).

In some embodiments, the boron source 320 may initially be provided within the substrate 312 during formation of the substrate 312 via a silicon melt infiltration (MI) process. For example, the MI process may include obtaining a preform of coated silicon-including fiber or other reinforcing fibers. A porous matrix composition may also be obtained, such as a matrix composition including SiC and C particles, and introduced into the preform. The MI process may further include adding liquid Si in the form of a Si—B alloy into the preform. The liquid Si—B alloy added to the preform may react with C in the matrix composition to form additional SiC. While some of the liquid Si—B alloy may be consumed in the reaction with C, part of it may remain in the CMC substrate 312. Such unconsumed Si—B alloy may form the boron source 320 provided within the substrate 312 that can diffuse through the substrate 312 and the bondcoat 314 and participate in the oxidation reaction to form a boron-doped oxide including silicon and at least 0.1 weight percent boron during exposure of the bondcoat 314 to an oxidizing environment at a temperature greater than 900 degrees Celsius.

In some other embodiments, the boron source 320 may initially be provided within the substrate 312 during formation of the substrate 312 via a polymer infiltration and pyrolysis (PIP) process. For example, such a PIP process may include obtaining a preform of reinforcing fibers, such as SiC fibers. A low viscosity precursor may be infiltrated into the preform (e.g., introduced into pores of, and/or between, the reinforcing fibers). In some embodiments, the matrix precursor may include the boron source 320. The PIP process may further include curing and/or pyrolyzing (i.e., ceramizing) the matrix precursor in the preform in a non-oxidizing atmosphere to form a ceramic matrix about the reinforcing fibers. The infiltrating and pyrolyzing processes may be repeated a plurality of times to, ultimately, reduce the porosity of the ceramic matrix to an acceptable level to form the ceramic substrate 312 with the boron source 320 therein.

As discussed above, in some embodiments the matrix precursor composition may include the boron source 320. In such embodiments, the boron source 320 may be selected such that it remains after pyrolysis (and crystallization) in the formed CMC substrate 312. In this way, after pyrolysis (and crystallization) the boron source 320 is provided within the substrate 312 and is able to diffuse through the CMC substrate 312 and the bondcoat 314 and participate in the oxidation reaction of the bondcoat 314 to form the oxide region including silicon and at least about 0.1 wt % boron during exposure of the bondcoat 314 to an oxidizing environment at a temperature greater than 900 degrees Celsius. In some embodiments, the matrix precursor composition may include an organosilicon polymer including boron, such as polycarbosilane with boron including species (e.g., for use with SiC reinforcing fibers) or polysilazane, with boron including species (e.g., for use with SiCN or Si3N4 reinforcing fibers). In some embodiments, the matrix precursor composition may include a polyborocarbosilazane and/or polyborocarbosilane with or without additional boron species.

In some other embodiments, the boron source 320 may initially be provided within the substrate 312 during formation of the substrate 312 via a chemical vapor infiltration (CVI) process. For example, such a CVI process may include obtaining a preform of reinforcing fibers, such as SiC fibers. A gaseous matrix precursor composition may also be obtained, and infiltrated into the preform (e.g., introduced into pores of, and/or between, the reinforcing fibers) by a gas phase reaction that takes place in the preform. For example, the preform may be heated in a reactor with the gaseous matrix precursor composition. When the preform is infiltrated with the matrix precursor composition, the gas may decompose to form a ceramic deposit on the surfaces of the reinforcing fibers to form the ceramic matrix. The infiltration and densification stages may be repeated until the preform is substantially closed to form the CMC substrate 312.

The gaseous matrix precursor composition of such a CVI process may include the boron source 320. In such embodiments, the boron source 320 in the gaseous matrix precursor composition may remain as boron or a boron-including compound, such as silicon boride, in the matrix after the infiltration, decomposition and densification stages that form the CMC substrate 312. In this way, after infiltration, decomposition and densification the boron source 320 is provided within the substrate 312 and is able to diffuse through the CMC substrate 312 and the bondcoat 314 and participate in the oxidation reaction of the bondcoat 314 to form the oxide region including silicon and at least about 0.1 wt % boron during exposure of the bondcoat 314 to an oxidizing environment at a temperature greater than 900 degrees Celsius. In some embodiments, the gaseous matrix precursor composition may be a boron-including gas. In some embodiments, the gaseous matrix precursor composition may include Si, C and boron species. In some such embodiments, the gaseous matrix precursor composition may include a silane, halide and/or hydrocarbon and boron species. In some embodiments, the gaseous matrix precursor composition may be a gas including boron that during decomposition and/or densification forms a boron and SiC solution or a discrete SiBx phase (e.g., depending on the process temperature the gas concentration). In some embodiments, the boron-including gas may include at least one of triisopropyl borate, trimethylboron, triethylboron, triphenylborane, diborane, ammonia borane, borazine, tris(pentafluorophenyl) borane, and bron halides.

As noted above, a particular boron source, such as boron nitride, may form gaseous byproducts as it decomposes and participates in an oxidation reaction of a bondcoat to form a boron-doped oxide region. FIG. 7 illustrates an embodiment of an article 410 that includes such a bondcoat 414 that forms gaseous byproducts as it decomposes in the oxidation reaction. Article 410 is substantially similar to the articles 10, 110, 210 and 310 described above, and therefore like reference numerals preceded with "4" are used to indicate like aspects or functions, and the description above directed to aspects or functions thereof (and the alternative embodiments thereof) equally applies to the article 410.

As shown in FIG. 7, an article 410 including such a bondcoat 414 that forms gaseous byproducts as it decomposes may include an EBC 416 with a porous layer 430. The porous layer 430 of the EBC 416 may be positioned proximate to the bondcoat 414 relative to the other portions of the EBC 416. The porous layer 430 may be operable to allow the gaseous byproducts formed upon oxidation of the bondcoat 414 to escape from the area of gas generation to prevent the buildup of a relatively high pressure that may tend to delaminate the EBC 416. For example, the porous layer 430 may include a porosity level that is high enough to allow the gaseous byproducts to flow therethrough, and thereby away from the area of gas generation. The porous layer 430 of the EBC 416 may be advantageous when the bondcoat 414 and/or the substrate 412 includes the boron source 420.

FIG. 8 illustrates article 510 that forms boron-including gaseous byproducts as it decomposes. Article 510 is substantially similar to the articles 10, 110, 210, 310 and 410 described above, and therefore like reference numerals preceded with "5" are used to indicate like aspects or functions, and the description above directed to aspects or functions thereof (and the alternative embodiments thereof) equally applies to the article 510. Article 510 differs from article 410 in that the EBC 516 includes a hermetic layer 540 that prevents the migration of the boron-including gaseous byproducts out of the article 510 and into the atmosphere, thus maintaining or directing an adequate supply of boron to promote formation of the boron-doped oxide region including at least about 0.1 wt % boron. The hermetic layer 540 of the EBC 516 may be advantageous when the EBC 516 includes the boron source 520. In such embodiments, at least the portion of the EBC 516 including the boron source 520 may be positioned between the hermetic layer 540 and the site of the oxidation reaction (e.g., a TGO layer).

Figure 9:
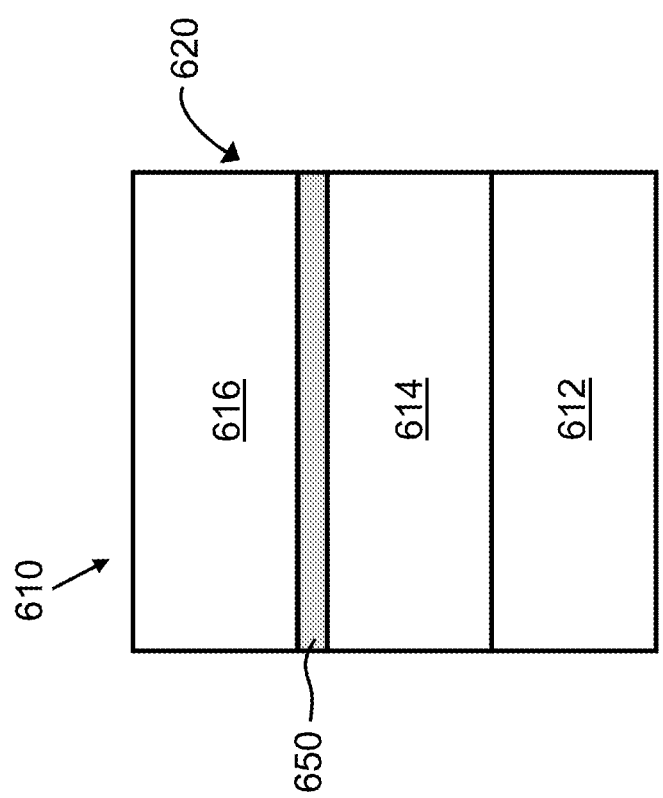
FIG. 9 depicts a cross-section of a portion of another article according to the present disclosure.

FIG. 9 illustrates a portion of another article 610 according to the present disclosure. Article 610 is substantially similar to the articles 10, 110, 210, 310, 410 and 510 described above, and therefore like reference numerals preceded with "6" are used to indicate like aspects or functions, and the description above directed to aspects or functions thereof (and the alternative embodiments thereof) equally applies to the article 610. Article 610 includes an intermediate layer 650 positioned proximate to the portion of the bondcoat 614 undergoing (or will undergo) the oxidation reaction. For example, the intermediate layer 650 may be interposed between at least a portion of the bondcoat 614 and at least a portion of the EBC 616. As such, this intermediate layer 650 may be positioned immediately adjacent an oxide layer formed on or otherwise located on the bondcoat 614, or at a location where an oxide layer will form.

At least a portion of the boron source 620 may be provided within the intermediate layer 650. As the boron source 620 in the intermediate layer 650 is proximate to the oxide, the boron source 620 within the intermediate layer 650 can dope the oxide promptly upon exposure of the bondcoat 614 to oxidizing conditions. In this way, such boron does not need to diffuse through the article 610 to dope the oxide (e.g., TGO) over a period of exposure time. The boron source 620 within the intermediate layer 650 may dope the oxide with a relatively large amount of boron over a relatively short period of exposure time. As another example, the intermediate layer 650 include a continuous or discontinuous borosilicate layer. The pre-deposited borosilicate intermediate layer 650 may thereby be the born including oxide layer or the boron including TGO as is thickens upon oxidation of the bondcoat 614. In such an example, the boron source 620 may or may not be included.

In some embodiments, the entirety of the boron source 620 is provided within the intermediate layer 650. In other embodiments, at least a portion of the boron source 620 is provided within the intermediate layer 650 and at least another portion of the boron source is disposed in another portion of the article 610, such as within the substrate 612, the bondcoat 614 and/or the EBC 616. The portion of the boron source 620 provided within the intermediate layer 650 may dope the oxide layer promptly upon exposure of the bondcoat 614 to oxidizing conditions, and the portion of the boron source 620 provided elsewhere in the article 610 may dope the oxide over a subsequent period of exposure time.

The articles disclosed herein may form, at least in part, any article, component or structure for use in high temperature applications. For example, the articles disclosed herein may be, at least in part, a turbine blade, combustor, shroud, nozzle, and/or heat shield. The portions or layers of the articles disclosed herein, such as the substrates, bondcoats and EBCs thereof, may be manufactured using conventional methods known to those skilled in the art to produce such portions or layers. For example, at least the bondcoats and EBCs of the articles disclosed herein may be manufactured using conventional methods known to those skilled in the art to produce such layers or portions. Such conventional methods may generally include, but should not be limited to, plasma spraying (e.g., atmospheric or low pressure with dry powders, suspensions, or solutions), combustion thermal spraying (e.g., high velocity oxygen fuel (HVOF), high velocity air fuel (HVAF)), chemical vapor deposition (CVD), physical vapor deposition (e.g., electron beam physical vapor deposition (EBPVD), sputtering), sol-gel, slurry processes (e.g., dipping, spraying, electrophoretic deposition, tape-casting, rolling, and painting), and combinations of these methods. Once the portion or layers of the articles disclosed herein are initially formed, they may be further treated (e.g., dried, pyrolized, calcined, sintered), and may optionally be even further treated, such as by exposure to boron-including precursors.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the disclosure without departing from its scope. While the dimensions and types of materials described herein are intended to define the parameters of the disclosure, they are by no means limiting and are exemplary embodiments. Many other embodiments will be apparent to those of ordinary skill in the art upon reviewing the above description. The scope of the disclosure should, therefore, be determined with reference to the appended claims, along with the full scope of equivalents to which such claims are entitled.

In the appended description, the terms "including" and "in which" are used as the plain-English equivalents of the respective terms "comprising" and "wherein." Moreover, in the following claims, the terms "first," "second," etc. if any, are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the disclosure, including the best mode, and also to enable any person of ordinary skill in the art to practice the embodiments of disclosure, including making and using any devices or systems and performing any incorporated methods. The patentable scope of the disclosure is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

While the invention has been described in detail in connection with only a limited number of embodiments, it should be readily understood that the invention is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the invention have been described, it is to be understood that aspects of the disclosure may include only some of the described embodiments. Accordingly, the disclosure is not to be seen as limited by the foregoing description, but is only limited by the scope of the appended claims.

The invention claimed is:

1. An article comprising:
a substrate comprising a silicon-including material;
an environmental barrier coating (EBC) disposed over the substrate;
a bondcoat disposed between the substrate and the EBC, the bondcoat comprising elemental silicon, silicon carbide, silicon nitride, a metal silicide, a silicon alloy, or mixtures thereof or the bondcoat comprising oxide phases of silicon including silica, rare earth silicates, rare earth aluminosilicates, and/or alkaline earth aluminosilicates; and
a boron selected from the group consisting of elemental boron in solid silicon solution, boron nitride, boron carbide boron oxide, a metal boride, and combinations thereof source disposed to provide an effective amount of boron to form an oxide comprising silicon and at least 0.1 weight percent boron during exposure of the bondcoat to an oxidizing environment at a temperature greater than 900 degrees Celsius, wherein the substrate, the EBC, or both of these, include the boron source.

2. The article of claim 1, wherein the boron source includes elemental boron in silicon solid solution.

3. The article of claim 1, wherein the EBC includes a porous layer proximate the bondcoat.

4. The article of claim 1, wherein the EBC includes a hermetic layer.

5. The article of claim 4, wherein the EBC includes the boron source.

6. The article of claim 1, wherein at least a portion of the boron source is interposed between at least a portion of the bondcoat and at least a portion of the EBC.

7. The article of claim 6, wherein at least one other portion of the boron source is disposed within the substrate, the EBC, the bondcoat, or combinations including any of the foregoing.

8. The article of claim 1, further comprising a layer of oxide disposed between the EBC and the bondcoat, wherein the layer of oxide comprises silicon and at least about 0.1 weight percent boron.

9. The article of claim 1, wherein the silicon-including material of the substrate is a ceramic matrix composite (CMC).

10. The article of claim 1, wherein the oxide comprises at least about 0.5 wt % boron.

11. The article of claim 1, wherein the oxide comprises no more than about 10 wt % boron.

12. The article of claim 1, wherein the oxide is substantially amorphous and substantially devitrification resistant.

13. The article of claim 1, wherein the oxide is disposed between the bondcoat and the EBC.

14. The article of claim 1, wherein the bondcoat also includes the boron source.

15. An article comprising:
a substrate comprising a silicon-including material;
an environmental barrier coating (EBC) disposed over the substrate;
a bondcoat disposed between the substrate and the EBC, the bondcoat comprising elemental silicon, silicon carbide, silicon nitride, a metal silicide, a silicon alloy, or mixtures thereof or the bondcoat comprising oxide phases of silicon including silica, rare earth silicates, rare earth aluminosilicates, and/or alkaline earth aluminosilicates;

an oxide adjacent the bondcoat comprising silicon and at least 0.1% boron; and a boron selected from the group consisting of elemental boron in solid silicon solution, boron nitride, boron carbide boron oxide, a metal boride, and combinations thereof source disposed to provide boron to the oxide during exposure of the bondcoat to an oxidizing environment at a temperature greater than 900 degrees Celsius, wherein the substrate, the EBC, or both of these, include the boron source.

16. The article of claim 15, wherein the oxide comprises at least 0.5 weight percent boron.

17. The article of claim 15, wherein the oxide is substantially amorphous and devitrification resistant.

18. The article of claim 15, wherein the bondcoat also includes the boron source.

19. An article comprising:
a substrate comprising a silicon-including material;
an environmental barrier coating (EBC) disposed over the substrate;
a bondcoat disposed between the substrate and the EBC, the bondcoat comprising elemental silicon; and
a boron selected from the group consisting of elemental boron in solid silicon solution, boron nitride, boron carbide boron oxide, a metal boride, and combinations thereof source disposed to provide an effective amount of boron to form an oxide comprising silicon and at least 0.1 weight percent boron during exposure of the bondcoat to an oxidizing environment at a temperature greater than 900 degrees Celsius, wherein the substrate, the EBC, or both of these, include the boron source.

20. The article of claim 19, wherein the boron source includes elemental boron in silicon solid solution.

21. The article of claim 19, wherein the EBC includes a porous layer proximate the bondcoat.

22. The article of claim 19, wherein the EBC includes a hermetic layer.

23. The article of claim 22, wherein the EBC includes the boron source.

24. The article of claim 19, wherein at least a portion of the boron source is interposed between at least a portion of the bondcoat and at least a portion of the EBC.

25. The article of claim 24, wherein at least one other portion of the boron source is disposed within the substrate, the EBC, the bondcoat, or combinations including any of the foregoing.

26. The article of claim 19, wherein the silicon-including material of the substrate is a ceramic matrix composite (CMC).

27. The article of claim 19, wherein the oxide comprises at least about 0.5 wt % boron.

28. The article of claim 19, wherein the oxide comprises no more than about 10 wt % boron.

29. The article of claim 19, wherein the oxide is substantially amorphous and substantially devitrification resistant.

30. The article of claim 19, wherein the oxide is disposed between the bondcoat and the EBC.

31. The article of claim 19, wherein the bondcoat also includes the boron source.

* * * * *